United States Patent [19]

Benett et al.

[11] Patent Number: 5,548,605
[45] Date of Patent: Aug. 20, 1996

[54] MONOLITHIC MICROCHANNEL HEATSINK

[75] Inventors: William J. Benett; Raymond J. Beach; Dino R. Ciarlo, all of Livermore, Calif.

[73] Assignee: The Regents of the University of California, Oakland, Calif.

[21] Appl. No.: 440,595

[22] Filed: May 15, 1995

[51] Int. Cl.$^6$ .................................................. H01S 3/04
[52] U.S. Cl. ........................................ 372/36; 372/70
[58] Field of Search .......................... 372/36, 34, 70, 372/75, 103

[56] References Cited

U.S. PATENT DOCUMENTS

| | | | |
|---|---|---|---|
| 4,315,225 | 2/1982 | Allen, Jr. et al. | 372/35 |
| 4,486,886 | 12/1984 | Ream | 372/34 |
| 4,719,631 | 1/1988 | Conaway | 372/34 |
| 5,040,187 | 8/1991 | Karpinski | 372/34 |
| 5,099,488 | 3/1992 | Ahrabi et al. | 372/361 |
| 5,105,429 | 4/1992 | Mundinger et al. | 372/34 |
| 5,105,430 | 4/1992 | Mundinger et al. | 372/35 |

*Primary Examiner*—Leon Scott, Jr.
*Attorney, Agent, or Firm*—Henry P. Sartorio; John P. Wooldridge

[57] ABSTRACT

A silicon wafer has slots sawn in it that allow diode laser bars to be mounted in contact with the silicon. Microchannels are etched into the back of the wafer to provide cooling of the diode bars. To facilitate getting the channels close to the diode bars, the channels are rotated from an angle perpendicular to the diode bars which allows increased penetration between the mounted diode bars. This invention enables the fabrication of monolithic silicon microchannel heatsinks for laser diodes. The heatsinks have low thermal resistance because of the close proximity of the microchannels to the laser diode being cooled. This allows high average power operation of two-dimensional laser diode arrays that have a high density of laser diode bars and therefore high optical power density.

19 Claims, 4 Drawing Sheets

MONOLITHIC MICROCHANNEL HEATSINK

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to microchannel cooling of laser diodes and more specifically, it relates to a monolithic microchannel heatsink for cooling laser diode arrays.

2. Description of Related Art

Laser diodes have many advantages over conventional lasers. Laser diodes are small and compact, they are efficient at converting electrical energy into laser energy, and they are reliable. However, when a laser diode is operated at a high average power, it generates a substantial amount of heat in a small volume, thereby raising the temperature of the diode which causes negative effects such as a wavelength shift and a loss of efficiency. If the temperature gets high enough, destruction of the diode package may result. Therefore, present uses of laser diodes are generally limited to applications requiring low average power.

When compared with other lasers, the laser diode is distinguishable by several features. One distinguishing feature is the size of the laser diode. Laser diodes can be manufactured in a package much smaller than other laser devices such as gas lasers that require large gas tubes and specialized optics equipment such as Brewster's windows, mirrors, spatial filters, and lenses. Another distinguishing feature of the laser diode is its efficiency at converting the input electrical power to output laser intensity. Laser diodes can readily achieve efficiencies of 50% or more in converting electrical energy to laser energy, while other lasers have efficiencies from 10% to less than 1%. For example, the highest efficiency achieved by other lasers is attained by the $CO_2$ laser, which may attain an efficiency of 10%. Despite the advantage of high efficiency, laser diodes have not been applied in high power applications due primarily to the problem of heat dissipation. Other lasers, such as the copper vapor lasers currently in use for high power applications, have an efficiency of 1% or less. Additional distinguishing features of the laser diode include a fast response to control signals, and simplicity of design. Manufacturing of laser diodes is known in the art, and a capability exists to manufacture many types of laser diodes.

One type of laser diode is the edge emitting laser diodes, often termed "laser diode bars". These diodes emit laser light along a length of their edge. For example, an edge emitting laser diode can output a beam that has an emitting edge length of one centimeter, and a width of 0.3 mm. Typically, an edge emitting laser diode will be manufactured of a single block of GaAs, with a pn junction formed in a plane throughout the block, and the facets positioned on opposing edges of the plane defined by the pn junction. Conductors are constructed on each side of the pn junction so that when current is applied, current passes through the pn junction. The current creates a population inversion across the pn junction, and lasing action can occur.

For any laser diode, heat production is directly associated with the output intensity. Further, a high output intensity results from a large current applied to the diode. The basic mechanisms leading to heat production in a diode are the series resistances of the diode and non-radiative recombination. The series resistances include the resistance of the semiconductor material, and the resistance of the contacts, which produce heat during current flow. The resistances produce heat as current is applied, in an amount of heat flux proportional to $I^2R$.

Due to this heat production, a basic limitation on the output intensity of a diode is temperature buildup from heat produced in the pumping process. For maximum efficiency, a diode must have a temperature that is below 25° C. For reliable, long lived operation of the diode, temperatures may be less than 50° C. without substantial loss of efficiency. Temperatures even moderately above 50° C. will substantially affect efficiency and reliability, substantially shortening the useful life of the diode. Furthermore, at higher temperatures the output light will be shifted in wavelength. High temperatures encourage the growth of defects in the laser diode, which decrease efficiency. A larger current may be applied to compensate for the decreased efficiency, which then produces even more heat, encouraging the growth of even more defects and a greater loss of efficiency. If a diode could be maintained at or near its optimum temperature, then the diode will have its maximum efficiency and lifetime, and emit a constant wavelength.

To reduce the temperature of the diode to an acceptable level while providing a high average output power, diodes are often operated in a pulsed mode wherein current is applied to the diode during only a portion of the operating time. In this mode, the heat has an opportunity to dissipate during the time when current is off. In the pulsed mode of operation, a figure that describes the percentage of time that the diode is pulsed is the "duty cycle". For example, a duty cycle of 1% corresponds to a diode that is actuated with current only once in 100 cycles. Typically, laser diodes will be operated at a duty cycle of 1% and a supplied current of fifty to a hundred amps/cm of length. However, if some extra cooling is available, higher duty cycles can be attained. If much more substantial cooling were available, continuous (cw) operation may be obtainable for optimum current levels. The cooling problem is of particular significance for arrays of laser diodes.

A feature of laser diode arrays is the high intensity output provided from the closely packed laser diodes. Another advantage of diode arrays is that the output beam's area can be made larger simply by increasing the area of the array. To obtain the higher intensity, the laser diodes in the array should be positioned closer together. However, as a result of close positioning, the heat flux from each laser bar will add with the heat flux of the adjoining laser bar, and without aggressive cooling the temperature may increase rapidly. At a high output power (a high intensity and long duty cycle), the amount of heat flux produced in each diode becomes very substantial.

As a result, the average output intensity of a diode array is substantially limited by its ability to sink heat. Using only ambient air cooling, average power output must be limited by maintaining the current and duty cycle at a level sufficient to prevent damaging temperature buildup. There is a tradeoff between output power and output pulse duration; a long duty cycle must be balanced by a small current, and conversely, a large current must be balanced by a short duty cycle. The heat flux in a diode array is substantial during a period of high output. Without additional cooling, a laser diode array operated at a high average power will produce a large heat flux which can cause a rapid temperature increase, leading to device failure and other temperature associated problems discussed above. Therefore, a higher intensity output will generally require a more effective cooling system.

It would be an advantage if a laser diode could be cooled sufficiently to produce a high average power. Such a laser diode array would have many uses including application as an efficient pump source for pulsed solid state lasers.

SUMMARY OF THE INVENTION

It is an object of the present invention to provide a monolithic microchannel heatsink for cooling laser diode arrays.

It is a further object of the present invention to sufficiently cool a laser diode array to produce a high average power.

A silicon wafer has slots sawn in it that allow diode laser bars to be mounted (soldered) in contact with the silicon. Microchannels are etched into the back of the wafer to provide cooling of the diode bars. To facilitate getting the channels close to the diode bars the channels are rotated from an angle perpendicular to the dioderelative which allows increased penetration between the mounted diode bars.

This invention enables the fabrication of monolithic silicon microchannel heatsinks for laser diodes. The heatsinks have low thermal resistance because of the close proximity of the microchannels to the laser diode being cooled. This allows high average power operation of two-dimensional laser diode arrays that have a high density of laser diode bars and therefore high optical power density. Monolithic silicon microchannel heatsinks have applications in cooling of high power diode laser arrays for use as a pump source for high power solid state lasers or any application where high power laser diode arrays are used. These heatsinks can also be used to cool other devices that generate high thermal loads.

The cost of fabricating silicon microchannel heatsinks combined with the cost of the packaging of a device such as a laser diode makes for a finished product that is costly to produce. Because of this fact there is a need to package multiple devices (laser diodes bars) on a single heatsink thereby creating two dimensional laser diode arrays.

DETAILED DESCRIPTION OF THE INVENTION

Laser diodes bars need to be mounted in an orientation that allows light to be emitted from the laser apertures and they need to be aggressively cooled to operate at high duty factor. Costs of fabrication are reduced when large numbers of laser diode bars are mounted on a single microchannel heatsink (back plane monolithic heatsink). In order to achieve aggressive cooling, the thermal impedance of the overall package needs to be extremely low. To obtain the level of thermal performance needed in a silicon microchannel heatsink package for high duty factor laser diodes, the laser diodes have to be in very close proximity to the microchannels. In order to meet these criteria it is necessary to mount the laser diode bars (arrays) within the silicon. This is accomplished by sawing or etching into the surface of the silicon wafer to create mounting surfaces for the laser diode bars that are oriented so the laser radiation can be emitted. These mounting surfaces can be rectangular shaped.

Anisotropic etching has been used to etch microchannels in silicon wafers for several years. The microchannel heatsinks that have been developed using this technology can have a very low thermal impedance and have been used to cool devices that generate extremely high thermal loads such as VLSI chips and laser diodes. Anisotropic etching of silicon takes advantage of the fact that some chemicals (most commonly potassium hydroxide) etch crystal planes of different orientation at different rates. The ratio of the etch rates for the (110) to the (111) planes can be as high as 600:1 but in practice is closer to 200:1. In <100> oriented wafers (the surface of the wafer is a (110) plane) the difference in etch rates can be exploited to etch channels that are perpendicular to the surface of the wafer. This is accomplished by creating a mask on the surface of the wafer that is aligned with the (111) planes in the wafer. When etched, these slow etching, perpendicular (111) planes then become the walls of the channels. Because these masks can be made photolithographically, the feature sizes created by this process can be very small and their resolution and accuracy tightly controlled.

Figure 1A:
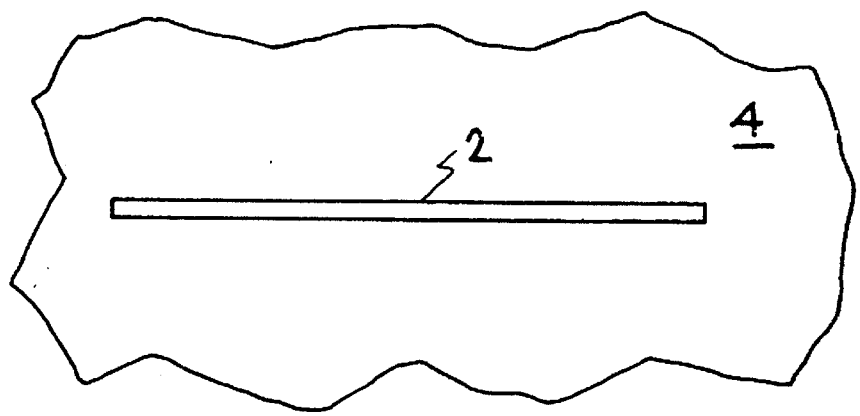
FIG. 1A (prior art) shows the opening in a silicon mask aligned to the (111) plane.
Figure 1B:
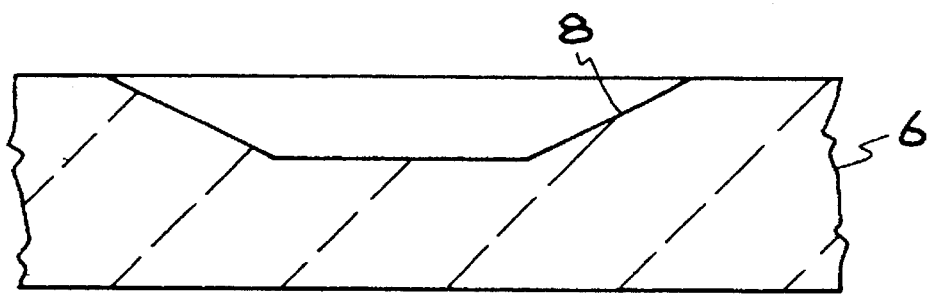
FIG. 1B (prior art) shows a sectional side view of the silicon mask of FIG. 1A where the etched feature is partially completed.
Figure 1C:
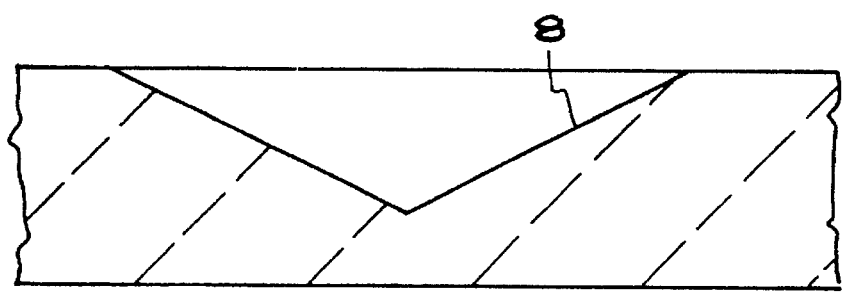
FIG. 1C shows a sectional side view of the silicon mask of FIG. 1A where the etched feature is etched to completion.

The problem addressed by this invention is that the channels created by anisotropic etching in <110> silicon cannot be terminated abruptly. This is because the end of the channels are defined by (111) planes that run at a 35.3° angle from the surface of the wafer and 54.7° angle from the (111) planes that define the channels. FIG. 1A (prior art) shows the opening 2 in the mask 4 aligned to the (111) plane of silicon substrate 6 shown in FIG. 1B. A sectional view of the etched feature 8 partially completed is shown in FIG. 1B. Etched feature 8 is shown to completion in FIG. 1C.

Figure 2A:
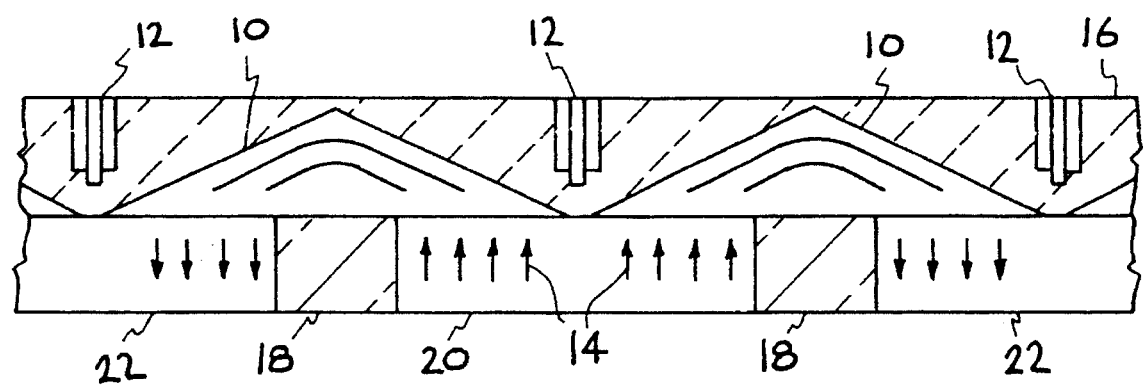
FIG. 2A shows etched cooling channels running end to end and the resulting diode bar spacing.
Figure 2B:
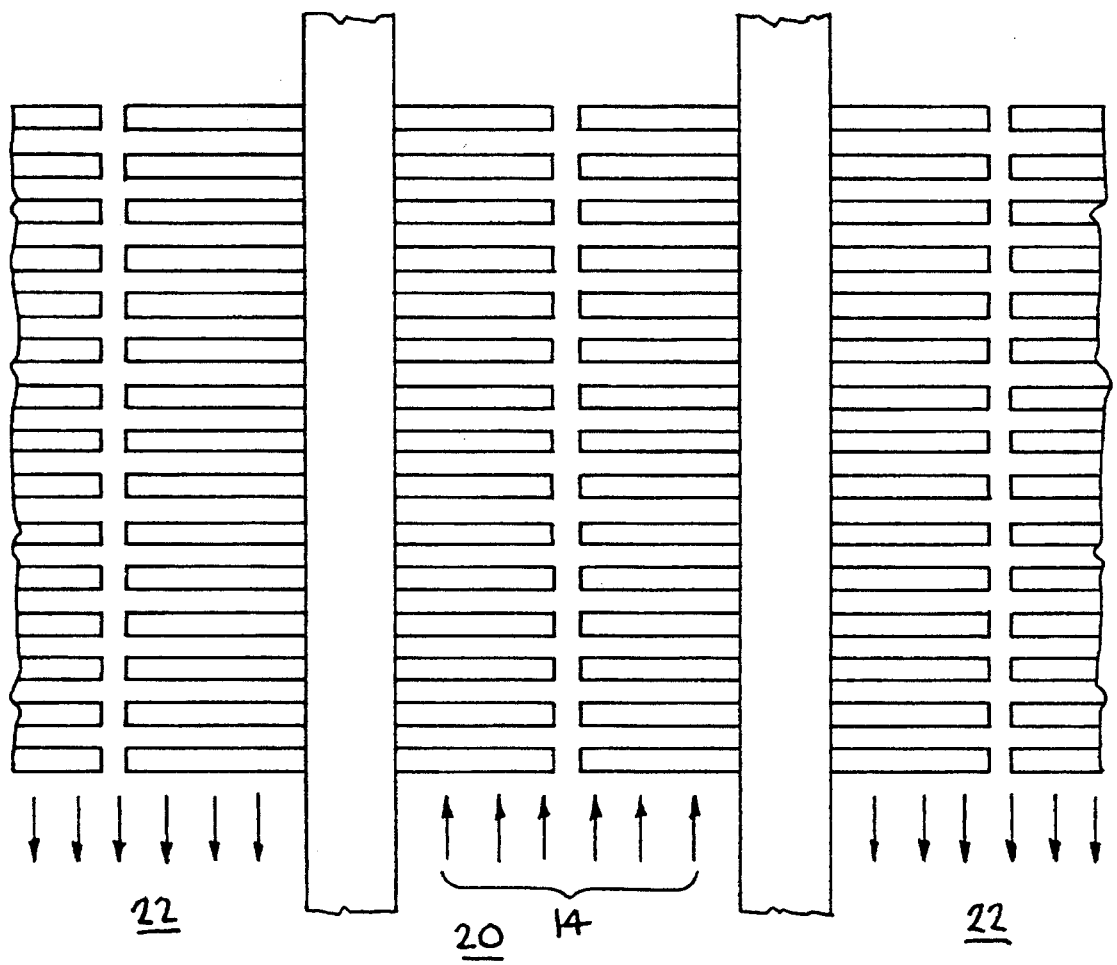
FIG. 2B shows the back plane view of the cooling channels of FIG. 2A.

In the monolithic back plane heatsink design, the angled ends of the channels limit either the penetration of the channels and/or the spacing of the diode bars. FIG. 2A shows a side view of a prior art etched silicon microchannel heatsink with the channels 10 running end to end and the resulting spacing of diode bars 12. In this figure, water 14 flows into silicon heatsink 16 through glass manifold 18 at entrance portion 20. Water 14 flows through channels 10 of heatsink 16 and out through glass manifold 18 at exit portion 22, thus carrying heat from diode bars 12. FIG. 2B shows the back plane view of the prior art cooling channels of FIG. 2A. Water 14 flows into heatsink 16 at entrance portion 20 and out at exit portion 22.

In one embodiment of the present invention, a monolithic microchannel heatsink comprises a silicon substrate; a plurality of parallel laser diode bar slots formed in a first side of the substrate; a plurality of parallel microchannels formed in a second side of the substrate; and a glass water manifold formed in the second side of the substrate. The plurality of parallel microchannels are oriented at an angle θ with respect to the plurality of parallel laser diode bar slots, where 90°>θ>0°. The plurality of microchannels are thus angularly rotated with respect to the plurality of laser diode bar slots.

The microchannels are greater than 0° and less than 90° with respect to the plurality of laser diode bars and laser diode bar slots. Each laser diode bar is fixedly and thermally connected to the silicon substrate within a separate laser diode bar slot. The monolithic microchannel heatsink can be made by creating a mask on the surface of a <100>oriented silicon wafer; aligning the mask with the (111) plane of the wafer; and applying an etchant through the mask to the silicon wafer.

Figure 3A:
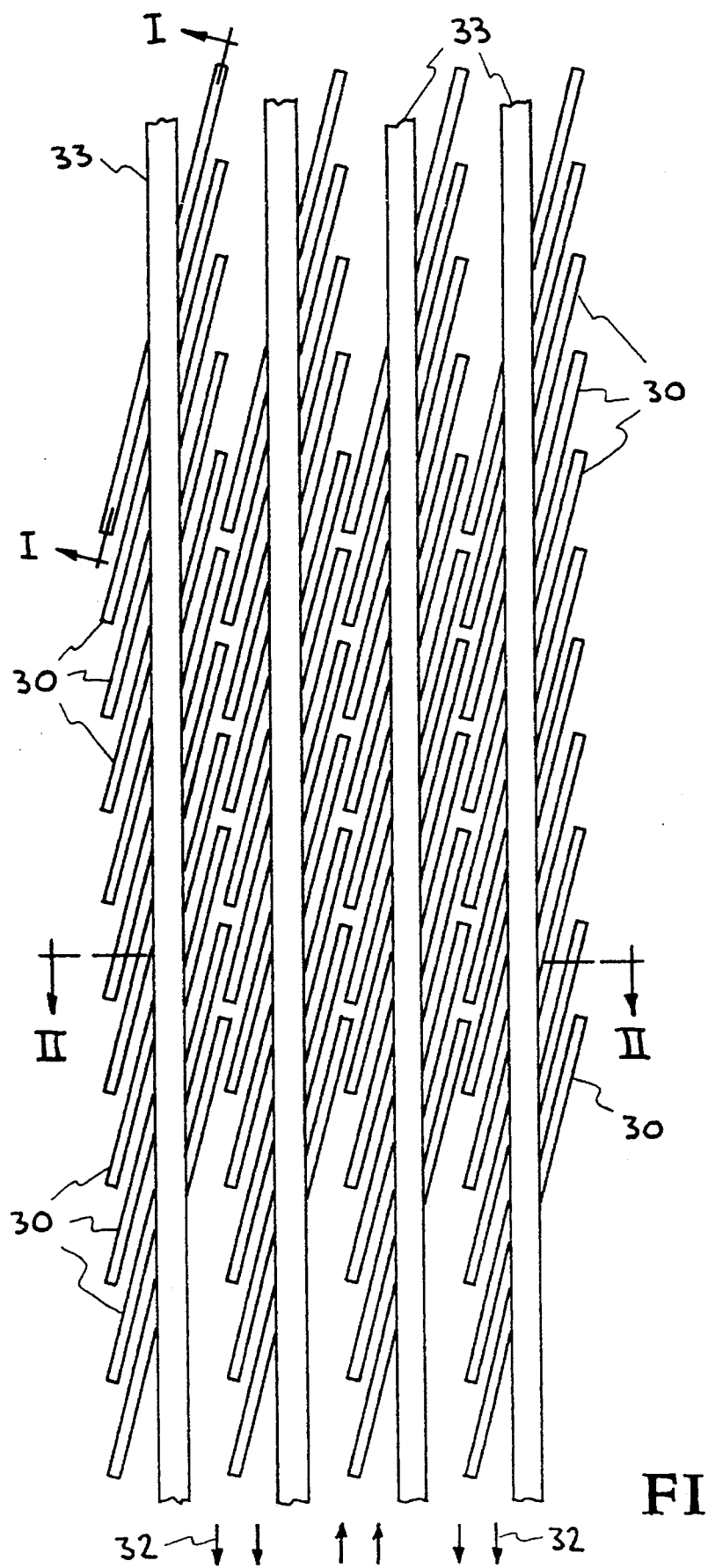
FIG. 3A shows a back plane view of etched cooling channels that have been rotated.
Figure 3B:
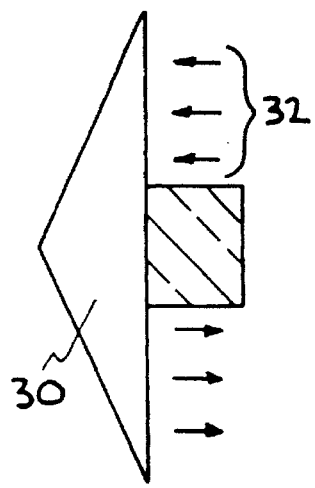
FIG. 3B shows a side view of section A—A of FIG. 3A.
Figure 3C:
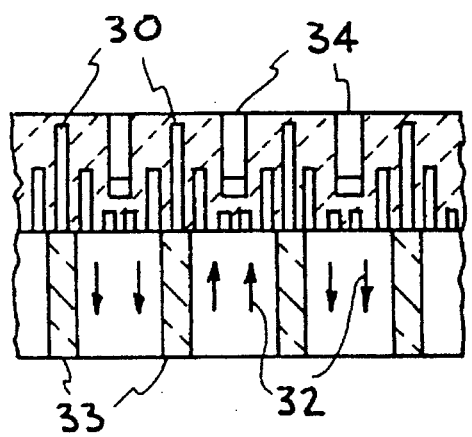
FIG. 3C shows a side view of section B—B of FIG. 3A.

By rotating the etched channels, the same penetration and a much closer spacing of the diode bars can be achieved. FIG. 3A shows a back plane view of an embodiment where the etched cooling channels 30 have been rotated. FIG. 3B shows a side view of section A—A of FIG. 3A, where water 32 flows around glass manifold 33 into channel 30. FIG. 3C shows a side view of section B—B of FIG. 3A with cooling channel 30, water flow 32 and manifold 33. Note that the diode bar 34 is also in much closer proximity to the cooling channels, thereby achieving a much lower thermal impedance and better performance.

It should be noted that the specific angular orientation of the cooling channels with respect to the laser diode bars and the laser diode bar slots will vary depending on the application. As the angle of the cooling channels decreases with respect to the diode bars, the closer a diode bar will be to an adjacent diode bar; however, the number of separate channels that cross and affect the cooling of a particular diode bar will decrease. The angle between the laser diode bars and the microchannels must increase, to a point, as the power output from the laser diode bars increases. The higher the laser power generated by the laser diode bars, the greater the need to cool the system. For any given structural dimensions and a particular power output requirement, an angle exists between the microchannel and the laser diode bars such that optimum cooling results.

Figure 4:
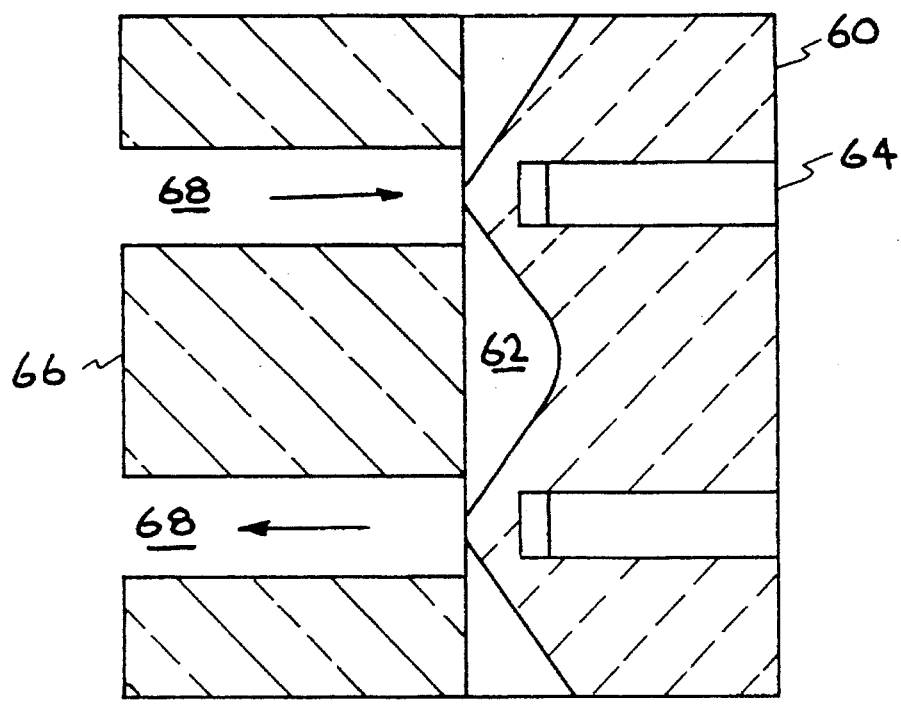
FIG. 4 shows an end view of one embodiment of the heatsink.

An end view of one embodiment of the heatsink 60, as shown in FIG. 4, has an etched cooling channel 62, diode bars 64 and water manifold 66 with flow channels 68. In this embodiment, heatsink 60 is 0.48 mm thick. The cooling channels 62 are 0.50 mm long, and can penetrate either 0.15 mm or 0.29 mm into heatsink 60. From center to center, the diode bars 64 are separated by 0.50 mm, are 0.10 mm thick and 0.35 mm in length. Water manifold 66 defines flow channels 68 which are 0.15 mm wide. When cooling channel 62 penetrates 0.15 mm into heatsink 60, cooling channel 62 is 55° with respect to diode bars 64 and flow channels 68.

Changes and modifications in the specifically described embodiments can be carried out without departing from the scope of the invention, which is intended to be limited by the scope of the appended claims:

We claim:

1. A monolithic microchannel heatsink, comprising:
    a substrate;
    a plurality of parallel laser diode bar slots formed in a first side of said substrate; and
    a plurality of parallel microchannels formed in a second side of said substrate;
    wherein said plurality of parallel microchannels are oriented at an angle θ with respect to said plurality of parallel laser diode bar slots, where 90°>θ>0°.

2. The monolithic microchannel heatsink of claim 1, wherein said substrate comprises silicon.

3. The monolithic microchannel heatsink of claim 1, wherein said plurality of laser diode bar slots comprise a rectangular shape.

4. The monolithic microchannel heatsink of claim 1, further comprising a water manifold fixedly attached to said second side of said substrate.

5. The monolithic microchannel heatsink of claim 4, wherein said water manifold comprises glass.

6. The monolithic microchannel heatsink of claim 1, further comprising a plurality of laser diode bars, wherein each laser diode bar of said plurality of laser diode bars is fixedly and thermally connected to said substrate within a separate slot of said plurality of parallel laser diode bar slots.

7. The monolithic microchannel heatsink of claim 6, wherein said plurality of laser diode bars is configured in a two-dimensional array.

8. A monolithic microchannel heatsink, comprising:
    a silicon substrate;
    a plurality of laser diode bar slots formed in a first side of said silicon substrate; and
    a plurality of microchannels formed in a second side of said silicon substrate;
    wherein said plurality of microchannels are angularly rotated with respect to said plurality of laser diode bar slots, wherein said microchannels are less than 90° with respect to said plurality of laser diode bar slots.

9. The monolithic microchannel heatsink of claim 8, wherein said plurality of laser diode bar slots comprise a rectangular shape.

10. The monolithic microchannel heatsink of claim 8, further comprising a water manifold fixedly attached to said second side of said substrate.

11. The monolithic microchannel heatsink of claim 10, wherein said water manifold comprises glass.

12. The monolithic microchannel heatsink of claim 8, further comprising a plurality of laser diode bars, wherein each laser diode bar of said plurality of laser diode bars is fixedly and thermally connected to said substrate within a separate slot of said plurality of parallel laser diode bar slots.

13. The monolithic microchannel heatsink of claim 12, wherein said plurality of laser diode bars is configured in a two-dimensional array.

14. The monolithic microchannel heatsink of claim 8, wherein said silicon substrate is 0.48 mm thick.

15. The monolithic microchannel heatsink of claim 8, wherein said microchannels penetrate 0.15 mm into said second side of said silicon substrate, wherein said microchannels are 0.50 long.

16. The monolithic microchannel heatsink of claim 8, wherein said microchannels penetrate 0.29 mm into said second side of said silicon substrate, wherein said microchannels are 0.50 long.

17. The monolithic microchannel heatsink of claim 8, wherein each laser diode bar slot of said plurality of laser diode bar slots are separated by 0.50 mm, are 0.10 mm long and are 0.35 mm in length.

18. The monolithic microchannel heatsink of claim 8, wherein said water manifold comprises 0.15 mm wide water flow channels.

19. A method of making a monolithic microchannel heatsink, comprising:
    (1) creating a mask on the surface of a <100> oriented silicon wafer; aligning said mask with the (111) plane of said wafer; and applying an etchant through said mask to said silicon wafer;
    (2) pluraly repeating step one to forming a plurality of parallel microchannels in a said silicon wafer; and
    (3) forming a plurality of parallel laser diode bar slots in said silicon wafer;
    wherein said plurality of parallel microchannels are oriented at an angle θ with respect to said plurality of parallel laser diode bar slots, where 90°>θ>0°.

* * * * *